Dec. 22, 1970 D. S. STODOLSKY 3,550,025

CLASS B TRANSISTOR POWER AMPLIFIER

Filed Oct. 16, 1968

INVENTOR

DAVID S. STODOLSKY

BY A Fred Starobin

ATTORNEY 3,550,025
CLASS B TRANSISTOR POWER AMPLIFIER
David S. Stodolsky, 6946 S. Euclid, Chicago, Ill. 60649
Filed Oct. 16, 1968, Ser. No. 768,000
Int. Cl. H03f 3/18
U.S. Cl. 330—17 3 Claims

ABSTRACT OF THE DISCLOSURE

In a class B transistor amplifier advantages of zero-bias operation and controlled overload protection are achieved through controlled power feedthrough from the driver of the amplifier to the load utilizing symmetrical driver, transistor logic, and power stages with feedback.

The present invention relates to power amplifiers and more particularly to class B audio-frequency transistor power amplifiers.

In the present invention the advantages of zero-bias operation and controlled overload protection can be achieved in a class B transistor amplifier through the use of controlled power feedthrough from the driver of the amplifier to the load.

The circuit of the present invention overcomes certain disadvantages present in prior art zero-bias class B circuits. One such circuit using high-impedance drive for elimination of crossover distortion has the disadvantage of requiring complementary output transistors or the use of a transformer which sacrifices a certain amount of thermal stability. The circuit of the present invention can be made as stable as desired through the use of emitter-base resistance or clamp voltages which can reverse-bias the output transistors at quiescence. Semi-complementary symmetry is used and both output transistors can be used to their fullest capacity.

Another prior art design has the disadvantage of continuous power dissipation at zero output through a resistor-diode network necessary for the implementation of the circuit. An objection to that prior art circuit is also in cases where very high linearity is demanded, the open-loop of this type of circuitry is unstable. In the circuit of the present invention, the switching point instability can be made arbitrarily small, and the gain change at switching can also be made very small by altering the power stage gain. With the design of the present invention it is possible to obtain better performance and also, where high reliability is necessary, an unstable open-loop system of the prior art is less desirable.

A great advantage of the present invention is seen as the comprehensive overload protection provided in the circuit. Zero-bias design is most useful at high power levels, and it is at these levels that overload protection becomes very important. The present protection circuit is an improvement in that each power stage is protected, not only against a short, but also against a low impedance and against failure of its complement.

These, as well as further advantages which are inherent in the invention, will become apparent from the following description, reference being had to the accompanying drawings wherein.

Figure 1:
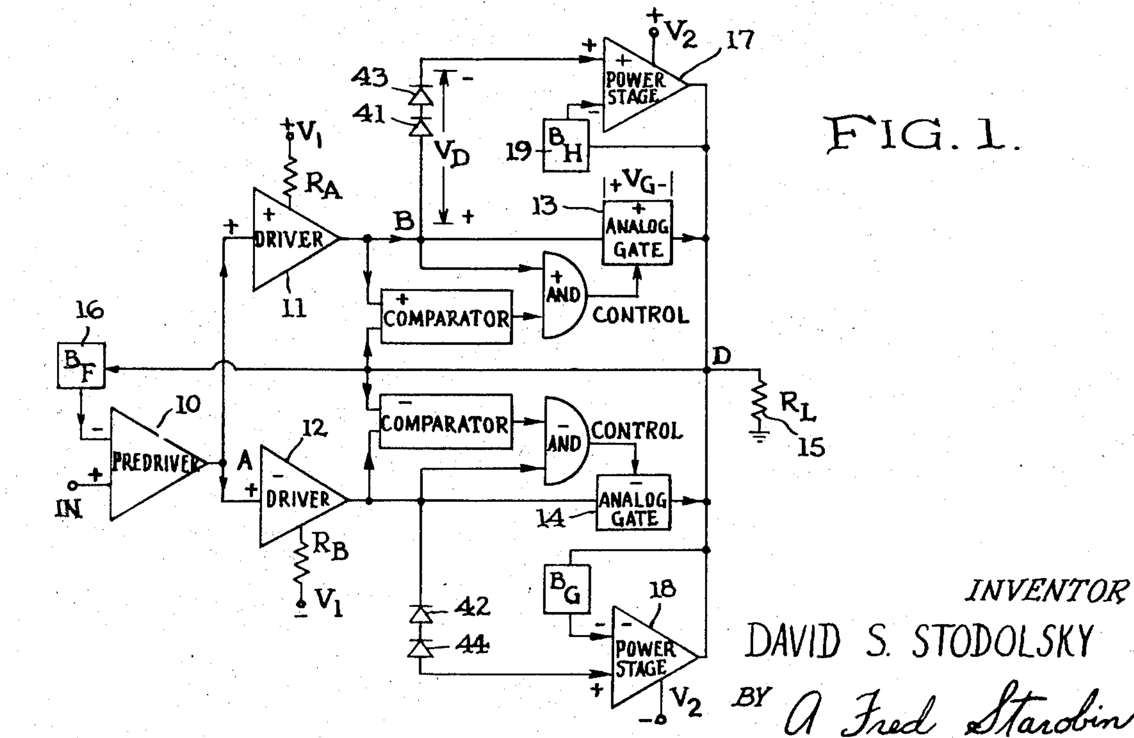
FIG. 1 is a block diagram of the amplifier of the present invention and its associated components.

Referring first to the block diagram of FIG. 1, it can be seen that the amplifier is symmetrical in operation, therefore examination of a positive cycle is sufficient for understanding the various modes of operation.

At zero voltage both drivers 11 and 12 and both gates 13 and 14 are on, permitting a small quiescent current through them. As the voltage swings positive, the negative driver 12 turns off, thereby opening the negative gate 14. During this time the load 15 is driven directly by the positive driver 11 through the positive gate 13. This continues until the threshold for the positive power stage 17 is reached (i.e., 1 volt) as determined by the following equation. If the voltage gain of the power stage 17 is greater than one, point D will become positive with respect to B at the power stage 17 threshold. This will cause the positive gate 13 to open, thereby isolating the driver 11 from the load 15, and power stage 17 input and output. For greater positive deviations the circuit operates as a conventional amplifier. The actual power stage 17 turn-on threshold can be determined as follows:

$$V_D = V_T - \beta V_{out_T} \quad V_{out_T} = V_G$$

By combining and solving for $V_{out_T}$ $$V_{out_T} = \frac{V_D - V_G}{1 - \beta}$$

where:

$V_T$=threshold voltage at B
$V_{out_T}$=threshold voltage (as measured at D)
$V_D$=voltage necessary to turn on stage with no feedback
$\beta$=power stage feedback
$V_G$=voltage drop across gate.

The open loop transfer function is then discontinuous at $V_{out_T}$ with a gain change determined by power stage $\beta$. A certain amount of care must be exercised in order to prevent positive feedback around the power stage at power stage turn on. Factors which were found to reduce this feedback include low source impedance for power stage, small voltage gain change at switching, and switching at a low level. Negative feedback was found effective in further reducing instability and in linearizing the closed loop transfer function.

For an examination of the overload protection consider what occurs if point D is shorted to ground before the start of a cycle. The positive driver 11 goes into saturation, and if the gate 13 resistance is much smaller than $R_A$, almost the entire supply voltage appears across $R_A$. Therefore, point B remains near ground and a small amount of power is dissipated in $R_A$. Point D does not have to be grounded to protect the amplifier; if the impedance to ground is below a specified value, the amplifier will be protected. For a resistive load, the power stage 17 will not turn on if point B cannot be driven to one volt.

If it is desired to drive a capacitive load but protect the amplifier against low resistance to ground, a capacitive reactance could be substituted for $R_A$.

If the output is shorted to ground during the part of the cycle when the output stage is on, instantaneous protective shut down will occur only if point B falls below one volt.

The amplifier is also protected in case the output is shorted against either power supply for a limited time. The maximum time depends upon the ability of the gate to dissipate power. If the positive half of the amplifier is shorted to the positive supply, there is no potential across the stage 17 and the result is no power dissipation. If it is shorted to the negative supply the driver 11 will be unable to bring point B to plus one volt. Therefore, only a small amount of power will be dissipated, and this will be divided between the gate 13 and $R_A$.

This circumstance protects the amplifier in case of collector-emitter breakdown of an output transistor. If an output transistor is shorted, its complement is shut off, preventing destruction of both positive and negative output transistors as is usually the case in class B amplifiers.

Figure 2:
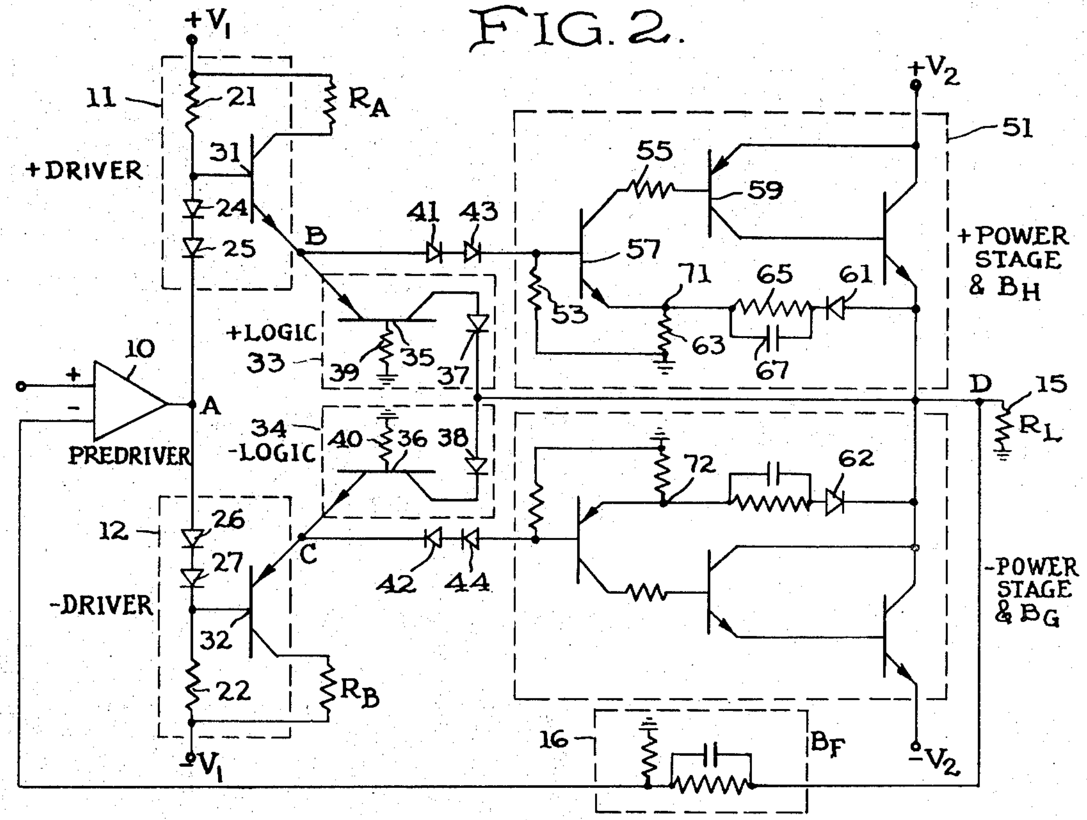
FIG. 2 is a schematic diagram of an embodiment of the present invention.

A summary of values for the different modules comprising the blocks designated in FIG. 1, when these modules are on or closed, is as follows:

+DRIVER—$A \geq 0$
+POWER STAGE—$B > 1$ volt
+COMPARATOR—$B \geq D$
+AND & ∴ +GATE—$A \geq 0$ & $B \geq D$
−DRIVER—$A \leq 0$
−POWER STAGE—$C < 1$ volt
−COMPARATOR—$C \leq D$
−AND & ∴ −GATE—$A \leq 0$ & $C \leq D$ FIG. 2 is a circuit embodiment of the present invention using an operational amplifier as predriver 10 with feedback 16 from load 15 to predrive 10. Resistors 21 and 22 provide a bias voltage across diodes 24 through 27 and also supply the necessary current to the respective bases of driver transistors 31 and 32. This bias current through diodes 24–27 produces sufficient voltage so that current flows through the driver 11, through the two logic elements 33 and 34, and back through the other driver 12 to the opposite power supply (−V). This potential can be adjusted so that the drivers 11 and 12 of FIG. 1 can be operated either as a conventional class B amplifier or a zero-biased amplifier. In any case, the current which the amplifier provides is limited by resistances $R_A$ and $R_B$.

The function of transistors 35 and 36 in logic blocks 33 and 34 respectively is to prevent current from flowing to the load 15 on the opposite half cycle, thus plus logic transistor 35 is turned off when the output is negative and vice versa. The function of the diodes 37 and 38 in logic blocks 33 and 34 respectively is to prevent current of the same polarity from flowing back to the input of the power stage 17 or 18 causing regeneration. The resistors 39 and 40 in logic blocks 33 and 34 respectively merely provide a ground reference without draining excessive current from either of drivers 11 or 12. The diodes 41–44 merely provide potential drops so that the power stage is not turned on until point B or C has reached a voltage which insures that the output has not been grounded. Unit 51 illustrates circuitry combining power stage 17 and power stage feedback 19 of the block diagram of FIG. 1, with resistors 63 and 65, capacitor 67, and diode 61 forming power stage feedback 19. In unit 51 resistor 53 provides for a small bias through diodes 41 and 43 so that the drop across them is more stable because the effects of diode leakage have been swamped out. Resistor 55 limits the current from transistor 57 to transistor 59, thereby limiting the output current of power stage 17 and of course the circuitry from unit 51. Diode 61 prevents the power stage 17 from being turned on via a negative output swing from power stage 18. The RC combination of resistors 63 and 65 and capacitor 67 sets the gain and frequency response of power stage 17 and unit 51.

Changes may be made in the circuitry while still remaining within the concept of the invention. For instance, the function of diodes 41 and 43 could be replaced by a resistance voltage divider, dropping the voltage between point B and ground, so that the potential drop from the base to the emitter of transistor 57 could serve the function which was previously served by two diodes and a transistor. If this change is made and if points 71 and 72 are tied together, then diodes 61 and 62 and some resistors and a capacitor would be eliminated, but this would not provide protection if one power transistor short circuited. As seen, changes may be made for a working amplifier but such changes must be made with discretion to avoid losing the advantages of the present invention and determination must be made as to the amount of circuit protection required before making such changes.

In regard to the parts shown in the figures, similar parts in FIGS. 1 and 2 are similarly labelled. The "comparator" and "and" functions are included in FIG. 1 as being helpful in visualizing the operation of the circuit. The function of these two elements and the analog gate are contained within the appropriate logic blocks 33 and 34 in FIG. 2.

Another change to be noted is the reduction in the positive feedback occurring at switching points if the power stage input signal is taken from the base of the driver transistors.

It will be obvious to those skilled in the art that various other changes may also be made without departing from the scope of the invention and the invention is not to be considered limited to what is shown in the drawings and described in the specification.

What is claimed is:

1. An amplifier having class B operation and comprising a pair of complementary drivers, one connected to a positive voltage supply and the other connected to a negative voltage supply, a load for the amplifier, a pair of logic circuits, one of said logic circuits connected between one of said drivers and said load, and the other of said logic circuits connected between the other of said drivers and said load, a pair of power stages, each with a feedback means connected from an output of one of said power stages back to an input of said same power stage, one of said power stages connected between one of said drivers and said load and the other of said power stages connected between the other of said drivers and said load, said drivers connected to each other and to a predriver unit, a feedback circuit connected between said load and said predriver unit, each of said logic circuits including analog gating means connected between said respective driver and said load, comparator means and AND function means connected to each other and between said respective driver and said analog gating means with said comparator means also connected to said load.

2. The amplifier of claim 1, further characterized by impedance means connected between each of said drivers and its respective voltage supply.

3. The amplifier of claim 1, further characterized by said feedback means of each of said pair of power stages including series connected resistors and parallelly connected capacitor with at least one of said resistors, and diode in series with said at least one resistor.

References Cited

UNITED STATES PATENTS

| | | | |
|---|---|---|---|
| 3,264,574 | 8/1966 | Loofburrow | 330—51 |
| 3,434,067 | 3/1969 | Eckelmann | 330—15 |
| 3,441,864 | 4/1969 | Aafler | 330—13X |
| 3,448,395 | 6/1969 | Webb | 330—17X |

ROY LAKE, Primary Examiner

J. B. MULLINS, Assistant Examiner

U.S. Cl. X.R.

330—28, 51, 151